United States Patent
Menzel et al.

(10) Patent No.: US 7,909,678 B2
(45) Date of Patent: Mar. 22, 2011

(54) METHOD FOR MANUFACTURING SILICONE WAFERS

(75) Inventors: Andreas Menzel, Jena (DE); Jochen Sigmund, Jena (DE); Christine Fugger, Jena (DE)

(73) Assignee: Schott AG, Mainz (DE)

( * ) Notice: Subject to any disclaimer, the term of this patent is extended or adjusted under 35 U.S.C. 154(b) by 206 days.

(21) Appl. No.: 12/197,498

(22) Filed: Aug. 25, 2008

(65) Prior Publication Data

US 2009/0061740 A1 Mar. 5, 2009

(30) Foreign Application Priority Data

Aug. 27, 2007 (DE) .......................... 10 2007 040 385
Aug. 27, 2007 (DE) .......................... 10 2007 040 390

(51) Int. Cl.
*B24B 49/00* (2006.01)

(52) U.S. Cl. ................ 451/41; 451/51; 451/54; 451/57

(58) Field of Classification Search ................... 451/41, 451/44, 51, 54, 57, 58, 65, 69
See application file for complete search history.

(56) References Cited

U.S. PATENT DOCUMENTS

| 4,331,452 A | * | 5/1982 | Causey et al. .................... 451/67 |
| 4,971,654 A |   | 11/1990 | Schnegg et al. |
| 5,484,326 A | * | 1/1996 | Hirano et al. .................... 451/41 |
| 5,918,587 A | * | 7/1999 | Hasegawa et al. .......... 125/23.01 |
| 6,099,748 A |   | 8/2000 | Netsu et al. |
| 6,431,964 B1 | * | 8/2002 | Ishikawa et al. ................. 451/65 |
| 6,979,247 B1 | * | 12/2005 | Ido ..................................... 451/8 |
| 2002/0036182 A1 | * | 3/2002 | Kajimoto et al. ................ 216/38 |
| 2002/0059815 A1 | * | 5/2002 | Terashima et al. .............. 65/416 |
| 2003/0119332 A1 |   | 6/2003 | Kuebelbeck et al. |
| 2006/0154575 A1 | * | 7/2006 | Kajimoto et al. ................ 451/41 |

FOREIGN PATENT DOCUMENTS

| DE | 37 28 693 | 3/1989 |
| DE | 199 62 136 | 6/2001 |
| DE | 101 47 761 | 5/2002 |
| DE | 102 07 385 | 9/2003 |
| EP | 1 178 526 | 2/2002 |
| EP | 1 674 558 | 6/2006 |
| JP | 2002-237476 | 8/2002 |
| JP | 2002237476 A | 8/2002 |
| JP | 2004006997 | 1/2004 |
| JP | 2007-208060 | 8/2007 |
| JP | 2007208060 A | 8/2007 |
| WO | 2005/122225 | 12/2005 |

OTHER PUBLICATIONS

International Standard ISO 10110-8, Feb. 2000, Din Deutsches Institut Fuer Normung E.V., Berlin, Germany (With Eng. Abst.).
International Standard ISO 4287, Oct. 1998, Din Deutsches Institut Fuer Normung E.V., Berlin, Germany (With Eng. Abst.).

* cited by examiner

*Primary Examiner* — Eileen P. Morgan
(74) *Attorney, Agent, or Firm* — Michael J. Striker

(57) ABSTRACT

A method of manufacturing silicon wafers that include a front surface and a block surface and lateral edges, includes forming a silicon wafer by separating a rectangular, in particular, silicon block with lateral surfaces and before separation, grounding and/or polishing the lateral surfaces of the silicon block parallel to the edge of the silicon wafer.

7 Claims, No Drawings

METHOD FOR MANUFACTURING SILICONE WAFERS

CROSS-REFERENCE TO RELATED APPLICATIONS

The disclosure in German Patent Application DE 10 2007 040 385.4 of Aug. 27, 2007, is expressly incorporated herein by reference thereto. This German Patent Application also describes the same invention that is described herein below and provides the basis for a claim of priority of invention under 35 U.S.C. 119 (a) to (d).

Furthermore co-pending U.S. patent application Ser. No. 12/197,523, filed on Aug. 25, 2008, contains and claims subject matter in common with the present application.

BACKGROUND OF THE INVENTION

The present invention relates to a method for manufacturing silicon wafers from a silicon block whose lateral surfaces are ground before separation is carried out.

Silicon wafers are thin sheets of crystalline silicon and are used to manufacture solar cells and, therefore, solar modules. In accordance with the increasing usage of solar cells and the like, the demand for silicon wafers is also increasing from year to year.

The production of silicon wafers begins with the manufacture of blocks of crystalline silicon ingots that are made of monocrystalline and polycrystalline material and are cultivated in a round shape or as cuboids. In a further step, these crystalline ingots are separated or sawed to form further cuboid blocks. These blocks are also referred to as columns or bricks; in the case of monocrystalline silicon, the cross section is nearly square in shape, and in the case of multicrystalline silicon, the cross section is exactly square in shape. In a further step, these blocks are sawed into the individual wafers, and, in fact, usually transversely to their longitudinal direction, so that the lateral surfaces of the column-shaped blocks or bricks created via sawing become the edge surfaces of the wafers produced in this manner. It has been shown that, when the bricks are manufactured, superfine, often microscopically small fissures are produced on the lateral surfaces created via sawing. These fissures penetrate the block, and therefore, the edges of the subsequent wafer, to a greater or lesser extent.

Silicon is an extremely brittle material. Unlike the situation with metals, a fissure in this material may therefore spread rapidly when stress is applied. Normal stressing, which occurs, e.g., when the cells are handled in production, may quickly result in fracture of the wafer if fissures are present, in particular in the edge of the wafer.

Since the costs required to manufacture the silicon wafer comprise approximately 55% of the total manufacturing costs for solar cells, a high percentage of broken silicon wafers, i.e., a high fracture rate, results in a marked increase in costs to manufacture solar cells.

Given that there is a worldwide shortage of silicon, the silicon wafers manufactured in the future will have to be extremely thin. If fissures form in these thin silicon wafers, they are extremely susceptible to fracture. Fissures in the edges of the wafers are particularly critical.

To avoid the problems described above, it is provided in US 2002 036182 AA to diminish the roughness of the surfaces of such silicon blocks before the silicon wafers are manufactured. The roughness of the surfaces is diminished via mechanical polishing, as described in JP 3,648,239. In the best case described (example 6), the roughness $R_y$ attained is only less than 1 µm. This is not nearly adequate for the manufacture of wafers, in particular those with a thickness that is less than or equal to 180 µm. In addition, the method variants described—"processing with loose grain" (method 1 and sponge wheel), processing with brushes with and without adhesive abrasive grains on the brush hairs, and processing with abrasive grains embedded in a sponge wheel—are definitely not suitable for the purpose of leaving defined, direction-critical processing tracks, which are necessary in order to obtain a greatly improved surface roughness on the lateral surfaces of the silicon bricks. Finally, a separating method for a semiconductor is described in U.S. Pat. No. 5,484,326, with which the surfaces of a silicon block are ground in advance.

It has been shown that this method does reduce the frequency of fracture of the cut silicon wafers, but that this is insufficient for very thin wafers in particular.

SUMMARY OF THE INVENTION

An object of the present invention, therefore, was to improve the fracture rate in the manufacture of silicon wafers, and to reduce it considerably. In particular, the object is to reduce the fracture rate in the production of extremely thin wafers with a thickness of 180 µm or less. The reduction shall also be attained using a technology that does not involve the removal of very small amounts of material—which are typical for mechanical polishing—per unit of time.

It has been shown, surprisingly, that the fracture rate of silicon wafers may be reduced to a particularly considerable extent when the lateral surfaces of a silicon block or brick are ground or polished such that the direction of grinding or polishing extends essentially parallel to the eventual cutting plane in which the wafers are cut or sawed out of the silicon block. As a result, the direction of grinding/polishing extends along the outer edge of the subsequent wafer.

In the sense of the present invention, "grinding" refers to an abrasive, mechanical surface treatment with which the grinding elements and/or grinding or cutting grains are not loose, but rather are bound, e.g., in a matrix. According to the present invention, the particular motion of the grinding and/or cutting particle or grain is essentially parallel to the eventual cutting plane, and therefore extends along the edge surface of the subsequent wafer. "Polishing", in the sense of the present invention, also means removing material in the ductile region using bound grains. "Removing material in the ductile region" means that the material is plastically deformed when it is removed, without the treated surface becoming damaged due to stress or strain. This ductile material removal is given when it is ensured via the grinding parameters that the penetration depth of the individual abrasive grains is less than 40 nm or 30 nm. The term "polishing" is used for a surface quality of this type that is attained via grinding because the quality criterium that is typical for polished surfaces, i.e., that the maximum roughness height $R_t$ be below the wavelength of light ($\lambda/2$ to $\lambda/60$), is met.

According to the present invention, "grinding" and/or "polishing" refer(s) to an abrasive mechanical surface treatment. Depending on whether the material is removed in the brittle-fracture region, in the transition region, or in the ductile region, almost no fissures form in the surface, or fissures are formed in the surface that extend more or less further into the material. Theoretically, removing material in the ductile region results in no fissures being formed. Practically speaking, abrasive grains may break out of their matrix and indeed produce small fissures due to uncontrolled motions.

The fissures that develop are only partially detectable using a measurement of roughness (e.g., using optical or mechanical profilometers, an atomic force microscope) of the surface. The methods listed above do not detect the portion of a fissure that is located below the surface. Fissures located below the surface are only partially detectable. The portion of a fissure, i.e., the defects located below the surface—fissures, in particular—are responsible for the material (e.g., of the wafer) subsequently tearing and bursting, however.

In the present invention, the lateral surfaces of the silicon block or brick represent—after the block has been cut—the circumferential surfaces, i.e., the edges of the wafer.

It was found that the roughness of the lateral surfaces of the silicon block is not the main cause of wafer fracture. Instead, superfine, microscopically small fissures and defects located below the surface and in layers close to the surface, i.e., subsurface defects, e.g., micro-fissures, are responsible for fractures that start at the edge of the wafer. It is precisely these subsurface defects that are formed when processing is carried out with loads that result in brittle fracture. It has been shown that the depth and course of the micro-fissures, in particular, are decisive factors in determining the fracture behavior of the silicon wafer. Fissures that extend perpendicularly to the cutting plane, i.e., perpendicularly to the lateral surface of the silicon brick or block, i.e., in the direction of the subsequent wafer surface, are particularly critical in terms of the fracture of the silicon wafer. In contrast, fissures that extend parallel to the cutting plane, i.e., parallel to—that is, along—the subsequent wafer edge have minimal influence on the fracture of the silicon wafer.

According to the present invention it was therefore found that the number of critical or less critical fissures that result in an eventual fracture of the silicon wafer depends significantly on the type of surface treatment used. It has been shown, in fact, that new critical defects are produced when the methods described in the related art are used, with which only the surface roughness is reduced using a grinding process. These new critical defects are produced via processing tracks that extend more or less perpendicularly to the longitudinal extension of the eventual wafer edge. Specifically these processing tracks are rotated due to the direction of processing, using the present invention. As a result, any processing tracks that remain after processing is carried out according to the present invention do not pose a risk of fracture. It has been shown, as a matter of fact, that fissures that extend parallel to the cutting plane, i.e., parallel to the subsequent wafer edge, have minimal influence on the fracture of the silicon wafers. Within the framework of the present invention it was found that, when this approach is used, it is no longer possible for fissures that result in wafer fracture to start at the deepest point in processing tracks such as these, but only at surface damage, the occurrence of which is unavoidable.

As a result of the inventive method, surface cracks created by moving abrasive devices extend essentially parallel to the wafer edge. When a sawed-off wafer is bent in the subsequent handling process, therefore, no fissures will develop from the deepest point of a surface crack of this type. When a block is processed as described in the related art (with the direction of the surface cracks rotated by 90°), however, when the wafers are bent, fissures start at the deepest point in the surface crack and result in fracture of the wafer.

DESCRIPTION OF THE PREFERRED EMBODIMENTS

In a preferred embodiment, the silicon block or brick is ground and/or polished using a tool with a cylindrical shape. In a preferred embodiment, the tool has the shape of a hollow cylinder. The end surfaces of the jacket of the hollow cylinder therefore serve as the grinding and/or polishing surfaces. Tools of this type are typically also referred to as grinding cups.

Preferably, the cylindrical tool has a diameter that is at least 1.5 times that of the width of the surface of the silicon brick to be treated, is particularly preferably 1.55 times, and is very particularly preferably 1.75 times that of the width of the surface of the silicon brick to be treated.

Grinding tools of this type that include a grinding cup are available, e.g., from Saint-Gobain Diamantwerkzeuge GmbH & Co KG in Norderstedt, Germany, from Wendt GmbH in Meerbusch, Germany, from Günter Effgen GmbH in Herstein, Germany, and from Herbert Arnold GmbH & Co KG in Weilburg, Germany.

The thickness of the hollow cylindrical jacket of the grinding tool and/or the grinding cup is typically at least 3 mm. Maximum reasonable thicknesses are typically 2 to 3 cm, and thicknesses of 1 cm to 2 cm are preferred. Thicknesses of 12 mm to 17 mm are very particularly preferred.

In a preferred embodiment, the grinding tool includes a matrix in which the particles of the abrasive device are embedded and/or are more or less fixedly bound.

Advantageously, the abrasive grains have a hardness that is much greater than that of crystalline silicon.

The abrasive grains are preferably composed of diamond, and grinding or cutting grains made of silicon carbide and/or silicon nitride have also proven to be suitable.

Preferably, a matrix made of a material is used that is selected from the group composed of a soft metal, e.g., bronze, at least one polymer, and at least one resin.

If abrasive grains are torn out of their matrix bond during the treatment process, the soft matrix material is also removed quickly and in an accelerated manner, thereby exposing new abrasive grains. This process is also referred to as "self-sharpening". In this case, the tool does not need to be replaced until the abrasive grains are removed, i.e., used up.

In an embodiment preferred according to the present invention, abrasive grains with a larger particle diameter, i.e., particles used for coarse pre-grinding, are embedded and/or bonded in a bronze matrix, but particles used for fine-grinding or post-grinding are embedded and bound in a plastic matrix.

The abrasive grains preferably have a mean diameter in the range of 3 µm to 160 µm. Various tools with grinding or polishing particles of various sizes and/or hardnesses are used depending on whether the block or brick is now ground to an exact size, or if it is ground particularly smooth and with little damage, and/or if the aim is to attain a surface with a polished quality. For example, if the dimension of a block is to be fixed, a grinding cup is used that includes abrasive or cutting grains or particles with a mean diameter of at least 80 µm and up to 160 µm. Particularly preferably, particles with a mean diameter of at least 85 µm and up to 130 µm are used. If a surface that is particularly damage-free is to be attained, however, as is carried out, e.g., in a further process that results in a second level of grinding and/or polishing quality according to a preferred inventive embodiment, then mean abrasive particle diameters of at least 3 µm and, in particular, at least 10 µm are typically used, while a maximum size of 40 µm, and preferably 25 µm has proven suitable. In a preferred inventive embodiment, the silicon block or brick is initially treated with a coarse-grain abrasive tool, and then with a fine-grain abrasive tool.

If the grinding tool includes abrasive grains with a mean diameter in the range of 80 µm to 160 µm, it is referred to as a coarse-grain grinding tool, in which case gritty abrasive grains or particles are used, which is also referred to as rough grinding.

When the grinding tool includes abrasive grains with a mean diameter in the range of 3 μm to 40 μm, it is referred to as a fine-grained grinding tool. A related process in which fine abrasive grains or particles are used is therefore also referred to as fine grinding.

A related process in which a grinding tool with fine abrasive grains is used can result in surface qualities that correspond to those of polished surfaces. When it is ensured via the process parameters that the penetration depth of the individual grinding particles is fixed at less than 40 nm—so that material removal takes place in the ductile region—it is ensured that the maximum roughness height $R_t$ is below the wavelength of light, i.e., in the range less than $\lambda/2$. The surface that is attained is then considered to be polished, within the sense of the present invention. It should be clarified at this point that the abrasive grains used for polishing using loose grains to attain a surface quality with a roughness height $R_t$ in the range less than $\lambda/2$ are those with a diameter that is generally less than or equal to 1 μm. In contrast, according to the inventive method, abrasive grains with a diameter greater than or equal to 3 μm are used to attain a finely-ground state, via brittle material removal, ductile material removal, or a type of material removal in the boundary region between the two mechanisms of material removal. Ductile material removal is carried out under conditions that permit a plastically deformable removal of material, without the material underneath becoming damaged, as is the case with brittle material removal. This is typically attained using rapid grinding at a high rate of speed, which results in local warming of the material to be removed, so that the abrasive grain removes and/or abrades the plastic material in a material-removing manner.

For coarse-grained grinding tools, a matrix made of a soft metal, e.g., bronze, is preferably used. For fine-grained grinding tools, however, a polymer or a synthetic resin is typically used as the matrix. According to the present invention, as a measure of the concentration of cutting grains in a plastic matrix or a synthetic resin matrix, a concentration is used that is available as a synthetic bond in the range C60 to C85. A concentration of C75 is preferably used.

The cutting speed of the grinding cup in the process described above is preferably set at approximately 20 m/s to 50 m/s. Per the relationship $$V_s = \pi * D * n$$

$V_s$=cutting speed
$\pi$=3.1416
D=diameter of cutting tool (grinding cup)
N=rotational speed
suitable values may be selected for D and n in order to set the desired cutting speed. A comparable speed may also be used for polishing as defined per the present invention. The grinding cup may have a diameter that is substantially greater than the width of the silicon blocks being ground. This makes it possible to use grinding cups with a diameter of 200 mm or greater to process silicon blocks of various widths, e.g., to process 5-inch, 6-inch or 8-inch silicon blocks, in order to cover the entire width of the silicon block in every processing step.

Material is removed from the silicon block in a material-removing and as gentle a manner as possible, in particular using a grinding tool, with a large diameter per the present invention, e.g., 200 mm to 350 mm, and with a high rotational speed, typically in the range of at least 1500, with at least 1800 or 2000 revolutions per minute being preferred. Typical advantageous maximum rotational speeds are, in particular, a maximum of 6000 revolutions per minute, and typically a maximum of 5000 revolutions per minute, with a maximum of 4000 revolutions per minute being preferred. Particularly preferred are maximum revolutions of 3500, in particular 3100 revolutions per minute, and rotational speeds of up to 3000 revolutions per minute are very particularly preferred. The inventive application of a large grinding cup therefore ensures that material will be removed quickly and that surface damage will be minimized.

Advantageously, the silicon block in the inventive method is essentially rectangular in shape. There are no limitations on the shape of the silicon block, however. As a result, the inventive method may also be used with silicon blocks that have a different shape. Advantageously, the silicon block has a square cross-sectional or main surface in the range between 220×220 mm² and 100×100 mm², preferably in the range between 125×125 mm² (5 inches), 156×156 mm² (6 inches) and 210×210 mm² (8 inches). Typical heights and lengths are at least 150 mm, in particular up to 600 mm, in particular up to 500 mm, and preferably a minimum of 200 mm and a maximum of 450 mm.

A thickness of at least 20 μm is ground off of the lateral surfaces of the silicon block or brick, and a minimum of 25 μm or 30 μm is particularly preferred. Abrading thickness of at least 50 μm have proven to be extremely suitable, in particular at least 130 μm or 150 μm, with at least 180 μm being particularly preferable. For economic reasons, maximum abrading thicknesses of up to 500 μm, and in particular up to 400 μm have proven to be suitable, with a maximum of 300 μm being preferred. Abrading thicknesses of up to 280 μm and 250 μm have proven to be very particularly preferred.

A further subject of the present invention is a method for manufacturing particularly thin silicon wafers by separating a silicon block or brick, in which case the lateral surfaces of the silicon block or brick—in the sense of the present invention—are ground and/or polished essentially parallel to the outer surface of the eventual wafer edge (cross-sectional edge of the brick and/or cutting plane) of the silicon block, and the silicon block is then cut into wafers parallel to the cross-sectional area of the brick (cutting plane) and/or perpendicularly to its longitudinal axis.

The lateral surfaces of the silicon brick are preferably ground or polished essentially parallel to the eventual cutting plane, in two steps. In a first step, a grinding tool is used that includes abrasive grains with a mean diameter that is greater than 90 μm. In a further abrasive treatment, a grinding tool is used that includes abrasive grains with a mean diameter that is preferably less than 30 μm, in particular less than 20 μm, and very particularly preferably less than 15 μm. This second processing step may be carried out by selecting a slower infeed rate, so that the penetration depth of the individual grinding grain does not exceed 40 nm and, in particular, 30 nm. As a result, the material is removed in the ductile region, and a surface quality is attained that corresponds to the quality criterium for polished surfaces. The grinding of the silicon block in two steps may take place by using grinding cups with abrasive grains having different diameters. If the aim is merely to attain a rough grind, the tool is guided across the surface repeatedly until the required amount of material is removed. If a fine grind is desired, the tool is also guided across the surface only once. If the aim is to attain a nearly interference-free surface that has been processed in a ductile manner, the surface may be ground freely (without infeeding once more with the tool moving across the surfaces). This additional step requires an exact support and guidance of the tool (aerostatic and/or hydrostatic tool spindle support and hydrostatic guidance). One skilled in the technical art understands that the infeed carried out each time the tool passes over the surfaces being processed also affects the quality of the surface. By testing infeed values in the range of 1 μm to 100 μm and/or a feed rate between 10 mm/min and 1000 mm/min, a process with an optimized process time and surface quality may be identified.

A further subject of the present invention, therefore, is a method for manufacturing silicon wafers, with which in a step a1)
the lateral surfaces of the silicon block are ground with a coarse-grained, hollow-cylindrical tool (a grinding cup). The tool preferably contains cutting and/or abrasive grains with a mean diameter that is greater than 80 μm, in particular greater than 90 μm, and up to 160 μm, and in a step a2)
it is ground or polished with a fine-grained, hollow-cylindrical tool that includes grinding and/or cutting grains with a mean diameter than is less than 30 μm, preferably less than 20 μm, and particularly preferably less than 15 μm, and typically has a minimum diameter of 3 μm, and in a step c)
the silicon block is cut and/or sawed as described above.

If coarse grinding is followed by fine grinding, it has proven particularly advantageous for the ratio of material removal of coarse grinding to fine grinding to be at least 5:1, and preferably at least 8:1 or 9:1. The maximum ratio of coarse grinding to fine grinding is 12:1, with a ratio of 10:1 being preferred.

Within the framework of the present invention, a microfissure is understood to mean a separating gap created via mechanical damage to the material, in which parts of a solid that was previously one piece are in contact with each other. The cross section of a fissure usually has a sharp tip.

When a hollow-cylindrical cutting or polishing tool that rotates around its hollow-cylindrical axis is used, then—in a design that is very particularly preferred according to the present invention—the rotation axis is tilted slightly relative to the surface normal to be ground, i.e., relative to the normal that is oriented at a right angle to the surface to be treated, and, in fact, preferably in the direction of the longitudinal axis of the brick. The rotation axis may be tilted toward the front or the rear. Typical maximum inclination angles are 0.1 or 0.07 angular degrees, with a maximum of 0.05 angular degrees being preferred, and a maximum of 0.04 angular degrees being particulary preferred. Minimal inclination angles are typically 0.001 or, in particular, 0.003 angular degrees, with a minimum of 0.005 angular degrees being preferred, and a minimum of 0.008 angular degrees being particulary preferred. According to the present invention, it was also discovered that, by tilting the angle of rotation, the particularly sensitive longitudinal edges of the bricks are subjected to less stress, since the grinding and polishing pressure applied by the tool is reduced there. In addition, the inclination (tilt) prevents the side of the tool that is opposite—by 180°—to the side that is engaged with the material from coming in contact with the surface to be processed. Material-engagement states that fluctuate and are therefore undefined are thereby prevented.

In an embodiment that is particularly preferred according to the present invention, the silicon block or silicon brick is subjected to isotropic etching after the grinding and/or polishing of the lateral surfaces described above, and before they are cut and/or sawed into silicon wafers, as described in the parallel application (DE 10 2007 040 390 A) submitted at the same time.

Within the sense of the present invention, "etching" refers to the chemical removal and/or dissolution of material, i.e., silicon material, and, in fact, also in the recesses and/or fissures present on or under the surface. According to the present invention, the term "isotropic etching" therefore refers to the removal of material using a chemical process that takes place at a more or less even speed in every crystal direction, i.e., the etching speed is essentially uniform along the <100>-plane, the <111>-plane, and the <110>-plane. According to the present invention, etching is referred to as being isotropic when the etching speed is essentially uniform in various crystal directions, and preferably does not differ by more than 3-fold and, in particular, not by more than 2-fold.

In addition, according to the present invention, etching is carried out such that the material is removed from the particular surface of the silicon brick in a more or less uniform manner. Within the framework of the present invention, an essentially uniform removal of material means that the extent of material removal over the entire particular lateral surface does not fluctuate by more than 10 μm, with maximum fluctuations of 9 μm, and, in particular 5 μm or 4 μm being particularly preferred.

With the inventive method, etching is typically carried out with a mean material-removal speed of 1 μm to 20 μm per minute, in particular of 3 μm to 15 μm per minute.

In this manner, fissures in the wafer are prevented from propagating from the wafer edge toward the interior of the wafer. The fracture rate of the silicon wafers may therefore also be reduced markedly in this manner.

The silicon block is preferably etched for at least 30 seconds, preferably for at least 45 seconds, and particularly preferably for at least 60 seconds. A typical maximum duration of treatment is 300 seconds, with a maximum of 250 seconds being preferred, and a maximum of 200 or 150 seconds being particularly preferred. The duration also depends on the size of the surface, the temperature, and the etching formulation, and it is selected such that it is possible to perform isotropic etching or etching in the isotropic/anisotropic boundary region. The particular conditions for etching in the isotropic region and/or isotropic/anisotropic boundary region are to be determined by one skilled in the technical art based on a few trials.

The mean layer thickness to be removed depends on the starting state of the jacket surfaces of the brick before etching is begun. If the jacket surface of the brick is sawed raw, i.e., it is the result of a wire-sawing process (squares), then a mean material removal of 25 μm to 100 μm is required. If the jacket surface of the brick—after it has been sawed into a square shape—will be coarse-ground further (dimensional grinding), then a mean amount of 8 μm to 50 μm should be removed via etching. If the jacket surface of the brick will also be fine-ground, then a mean amount of only 5 μm to 25 μm should be removed via etching. If the jacket surface of the brick has been completely fine-ground in the ductile region, with the result that the surface meets the criterium for polished surfaces, i.e., the maximum roughness height $R_t$—at λ/2 to λ/60—is below the wavelength of light, then etching need not be carried out. Since a surface of this type is not 100% free of subsurface defects, due to abrasive grains that break free as a result of fine grinding, the risk of fracture of the wafer may be further reduced slightly by performing etching very briefly for 20 to 30 seconds.

The silicon block is preferably etched at the lowest temperature possible. For economic reasons, temperatures of at least 18° C. have proven advantageous, and temperatures of at least 20° C. have proven particularly advantageous. Further advantageous maximum temperatures are 23° C., and maximum temperatures of 22° C. are particularly preferred.

It was also determined according to the present invention that an isotropic behavior may be increased when the particular selected temperature fluctuates during the etching points, i.e., at various points on the silicon brick, by a maximum of +/−2° C. with a maximum difference of +/−1° C. being preferred, and a maximum difference of +/−0.5° C. being particularly preferred. Fluctuations that do not exceed +/−0.2° C. or +/−0.1° C. are very particularly preferred. The behavior must be isotropic during etching in order for the most constant temperature possible to be maintained.

The etching procedure used is a wet etching procedure, which is preferably carried out in an acidic medium. Preferred acids are highly oxidative acids such as sulphuric acid, nitric acid, and/or hydrofluoric acid, and the related peroxo acids thereof.

Preferably, the silicon block is etched with a solution of 50-70% nitric acid and 40-60% hydrofluoric acid in a ratio in the range of 10:1 to 1:1, and preferably in the range of 8:1 to 4:1, these ratios being volume ratios.

Further additives are typically added to this mixture, with the aim of moderating the reaction. A fluid such as water, acetic acid, hydrogen peroxide, or a surfactant (wetting agent) that reduces the surface energy is preferably added to the solution.

Within the framework of the present invention, the term "surface roughness" refers to the unevenness of the surface height.

The ratio of the surface roughness $R_{max}$ of the particular lateral surface being treated according to the present invention after etching to the surface roughness $R_{max}$ of the lateral surface before the etching process is preferably 10:1 to 0.5:1, typically from 8:1 to 0.5:1, and very particularly preferred in a range of 7:1 to 1:1.

It was also discovered according to the present invention that increasing the surface roughness does not result in any disadvantageous fracture properties, in particular when the initial surface is finely-ground. According to the present invention, the surface roughness defined by the unevenness in the surface created by etching may be very great—as stated above—provided that the width of the particular wave troughs and/or roughness troughs is great, and that their deepest points are rounded off.

According to the present invention, material may therefore be easily removed up to large etching depths of, e.g., 100 µm or 80 µm, although a maximum mean material removal of 70 µm is typically preferred. A particularly advantageous mean material removal of a surface that has been sawed but not treated further is a maximum of 50 µm or 40 µm.

If a silicon block pretreated with coarse grain is etched, minimum mean etching depths of at least 5 µm, in particular of at least 7 µm, and preferably of at least 8 µm have proven advantageous. Mean minimal etching depths of 10 µm are particularly preferred. The maximum mean etching depth in coarsely pre-ground materials is typically 50 µm, with a maximum of 40 µm being preferred, and a maximum of 30 µm being particularly preferred. In cases such as these, etching depths of up to 25 µm are very particularly preferred.

If a silicon block is etched that was ground and/or polished coarsely at first and then finely, minimum mean etching depths of at least 3 µm, and, in particular, of at least 4 µm have proven reasonable, with at least 5 µm and, in particular, at least 7 µm having proven to be particularly advantageous. Minimum etching depths of 8 µm are very particularly preferred. With silicon blocks that have been pretreated in this manner, a maximum thickness of material removal via etching of up to 30 µm has proven reasonable, with a maximum of 25 µm being preferred, and a maximum of 20 µm being particularly preferred. Maximum material-removal depths of up to 18 µm, and, in particular, up to 16 µm, are very particularly preferred.

It has also been shown, however, that, for economic reasons, an optimal duration of etching at an etching temperature and with material removal via etching is advantageously at least 30 seconds, and, in particular, at least 45 seconds. A lower limit of 60 seconds has proven to be particularly advantageous. Maximum etching durations are typically 300 seconds, with 250 seconds being preferred, and 200 or 150 seconds being very particularly preferred.

When silicon wafers manufactured according to one of the aforementioned methods are used to make solar cells, the yield of the solar cells is increased, since the fracture rate of the silicon wafers is markedly lower. The wafers obtained according to the present invention preferably have a thickness of less or equal to 180 µm, with thickness of less than 170 µm, in particular less than or equal to 150 µm or less than or equal to 120 µm being particularly preferred.

Advantageously, the silicon block or brick is cut into silicon wafers using a wire saw, as described, e.g., in EP 1 674 558 A1.

Silicon wafers that were manufactured using one of the aforementioned methods may be used in conventional methods known from the related art to produce solar cells and/or solar modules.

A further subject of the present invention is a silicon block that was manufactured using the inventive method, i.e., with which the lateral surfaces of a silicon block were cut essentially parallel to the eventual cutting plane and/or its cross-sectional surface, i.e., parallel to the eventual wafer edge, in at least one step.

The lateral surfaces of this ground silicon block preferably have a surface roughness $R_{max}$ of up to 8 µm, and particularly of up to 6 µm. Typical minimal values (lower limits) are 0.25 µm, and in particular 0.35 µm, with 0.5 µm or 1 µm typically sufficing. If only rough grinding is carried out, the surface roughness is preferably $R_{max}$ 3 µm to 6 or 8 µm. The surface roughness is the unevenness of the surface height. The surface roughness is greater than the surface roughness for polished surfaces defined per ISO 10110-8.

Preferably, this ground silicon block essentially has no micro-fissures when the ground silicon brick was processed in the ductile region. Depending on whether the ground silicon block was ground in a fine or coarse manner, micro-fissures occur, which—in the case of multi-crystalline bricks, and in the case of finely-ground bricks in particular—may not be quantified, because there are no analytical methods available. The surface quality may be evaluated very well using microscope images, however. The less disturbed the processing tracks are, the lower the sensitivity to fracture is of wafers made of bricks manufactured in this manner.

A further subject of the present invention is a silicon wafer that was obtained by separating a silicon block whose lateral surfaces were ground essentially parallel to the eventual wafer edge, and with which the lateral surfaces of the silicon block were etched isotropically, preferably in a further step. A wafer of this type usually no longer contains any micro-fissures as they are defined above.

The invention claimed is:

1. A method of making thin silicon wafers from a silicon block with a reduced wafer fracture rate, said silicon block having lateral surfaces, said method comprising the steps of:
   a) providing a coarse grained cylindrical grinding tool with cylindrical walls comprising coarse grains embedded in a matrix material and a fine grained cylindrical grinding tool with cylindrical walls comprising fine grains embedded in said matrix material, wherein said matrix material is selected from the group consisting of soft metal, polymers and resins, and wherein said coarse grains or said fine grains are diamond grains, silicon carbide grains or silicon nitride grains, said coarse grains have mean diameters that are at least 80 μm, and said fine grains have mean diameters that are not greater than 40 μm;

b) coarse grinding the lateral surfaces of the silicon block with said coarse grained cylindrical grinding tool;

c) after the coarse grinding of step b), fine grinding the lateral surface of the silicon block with said fine grained cylindrical grinding tool;

d) grinding off a layer that has a thickness of 20 μm to 400 μm from said lateral surfaces of said silicon block by the grinding of step b) and step c) in order to remove subsurface defects that cause fractures; and e) after the grinding of step b) and of step c), cutting a plurality of said silicon wafers from said silicon block;

whereby edge surfaces of the silicon wafers are formed from said lateral surfaces of said silicon block and fracture of said silicon wafers by said cutting is minimized.

2. The method as defined in claim 1, wherein a ratio of material removal during the coarse grinding to the material removal during the fine grinding is from 5:1 to 12:1.

3. The method as defined in claim 1, wherein the coarse grained cylindrical grinding tool and the fine grained cylindrical grinding tool are hollow and have respective diameters that are 1.5 times a width of said silicon block, and further comprising rotating the coarse grained cylindrical grinding tool and the fine grained cylindrical grinding tool about respective cylinder axes during the coarse grinding and the fine grinding.

4. The method as defined in claim 3, wherein during the grinding the respective cylinder axes are tilted at an angle of 0.005 to 0.05 angular degrees relative to a perpendicular normal to a surface of the silicon block that is being treated.

5. The method as defined in claim 1, wherein said mean diameters of said coarse grains are from 80 to 160 μm, and said mean diameters of said fine grains are from 3 μm to 40 μm.

6. The method as defined in claim 1, further comprising isotropically etching said lateral surfaces of said silicon block after said grinding but prior to said cutting to remove a layer from said silicon block that is from 3 μm to 30 μm thick.

7. The method as defined in claim 1, wherein during the cutting a wire saw cuts the silicon wafers from the silicon block.

* * * * *